US010234339B2

United States Patent
Chern et al.

(10) Patent No.: US 10,234,339 B2
(45) Date of Patent: Mar. 19, 2019

(54) FORCE SENSOR WITH NOISE SHIELDING LAYER

(71) Applicant: UNEO Inc., Taipei (TW)

(72) Inventors: Yann-Cherng Chern, Taipei (TW); Chih-Sheng Hou, Taipei (TW)

(73) Assignee: UNEO INC., Taipei (TW)

( * ) Notice: Subject to any disclaimer, the term of this patent is extended or adjusted under 35 U.S.C. 154(b) by 249 days.

(21) Appl. No.: 15/171,173

(22) Filed: Jun. 2, 2016

(65) Prior Publication Data
US 2017/0350771 A1    Dec. 7, 2017

(51) Int. Cl.
*G06F 3/044* (2006.01)
*G01L 1/14* (2006.01)
*H01L 41/113* (2006.01)
*H02N 1/08* (2006.01)
*G01L 1/18* (2006.01)
*G01L 1/16* (2006.01)
*H01L 41/053* (2006.01)

(52) U.S. Cl.
CPC .............. *G01L 1/144* (2013.01); *G01L 1/16* (2013.01); *G01L 1/18* (2013.01); *H01L 41/0533* (2013.01); *H01L 41/1132* (2013.01); *H02N 1/08* (2013.01); *G01L 1/14* (2013.01); *G06F 3/044* (2013.01)

(58) Field of Classification Search
CPC .......... G06F 3/044; G06F 2203/04104; G06F 2203/04107; G06F 2203/04103; G06F 3/041; G06F 3/0414
See application file for complete search history.

(56) References Cited

U.S. PATENT DOCUMENTS

| 8,766,925 | B2 * | 7/2014 | Perlin | G06F 3/0233 |
| | | | | 345/156 |
| 9,018,631 | B2 * | 4/2015 | Aichi | H01L 27/1214 |
| | | | | 257/71 |
| 9,081,440 | B2 * | 7/2015 | Chang | G06F 3/0418 |
| 9,377,908 | B2 * | 6/2016 | Park | G06F 3/044 |
| 9,772,731 | B2 * | 9/2017 | Lee | G06F 3/044 |
| 2007/0126707 | A1 * | 6/2007 | Jones | G06F 3/045 |
| | | | | 345/173 |
| 2009/0267917 | A1 * | 10/2009 | Lee | G02F 1/13338 |
| | | | | 345/174 |
| 2010/0026655 | A1 * | 2/2010 | Harley | G06F 3/044 |
| | | | | 345/174 |
| 2011/0048139 | A1 * | 3/2011 | Chen | G01L 9/0052 |
| | | | | 73/727 |
| 2012/0127113 | A1 * | 5/2012 | Yau | G06F 3/045 |
| | | | | 345/174 |
| 2012/0154990 | A1 * | 6/2012 | Yang | G06F 3/041 |
| | | | | 361/679.01 |
| 2012/0169652 | A1 * | 7/2012 | Chang | G06F 3/0418 |
| | | | | 345/174 |

(Continued)

*Primary Examiner* — David A Rogers
(74) *Attorney, Agent, or Firm* — Hauptman Ham, LLP (57) ABSTRACT

A force sensor having a noise shielding layer is disclosed. For a first embodiment, a top noise shielding layer is configured on a top surface of a force sensor to screen noise signals which are caused by human body's touch or approaching from top of the force sensor. For a second embodiment, a bottom noise shielding layer is configured on a bottom surface of the force sensor to screen noise signals which are caused by human body's touch or approaching from bottom of the force sensor.

19 Claims, 12 Drawing Sheets

(56) References Cited

U.S. PATENT DOCUMENTS

| | | | |
|---|---|---|---|
| 2013/0082267 A1* | 4/2013 | Aichi | H01L 27/1214 257/59 |
| 2013/0134992 A1* | 5/2013 | Zhu | G01M 3/18 324/658 |
| 2013/0342495 A1* | 12/2013 | Rappoport | H05K 9/0054 345/174 |
| 2014/0152943 A1* | 6/2014 | Dorjgotov | H05B 33/22 349/96 |
| 2015/0153767 A1* | 6/2015 | Nakayama | G06F 3/044 345/174 |
| 2015/0323843 A1* | 11/2015 | Park | G02F 1/13439 362/607 |
| 2015/0338963 A1* | 11/2015 | Lee | G06F 3/044 345/174 |
| 2015/0362777 A1* | 12/2015 | Aoki | G06F 3/0412 345/174 |
| 2016/0054184 A1* | 2/2016 | Chou | G01L 1/18 455/550.1 |
| 2016/0085342 A1* | 3/2016 | Mohapatra | H01H 1/58 345/174 |
| 2016/0170247 A1* | 6/2016 | Hassan | G02F 1/1339 349/42 |
| 2016/0188059 A1* | 6/2016 | Lee | G06F 3/0412 345/173 |
| 2016/0195997 A1* | 7/2016 | Lee | G06F 3/0412 345/174 |
| 2016/0209958 A1* | 7/2016 | Choi | G06F 3/044 |
| 2017/0023835 A1* | 1/2017 | Oh | G02F 1/13338 |
| 2017/0185196 A1* | 6/2017 | Kim | G06F 3/0412 |

\* cited by examiner

FORCE SENSOR WITH NOISE SHIELDING LAYER

BACKGROUND

Technical Field

The present invention relates to a force sensor, especially relates to a force sensor having a noise shielding layer configured on a top surface to screen noise signals caused by human body's touch.

Description of Related Art

Figure 1:
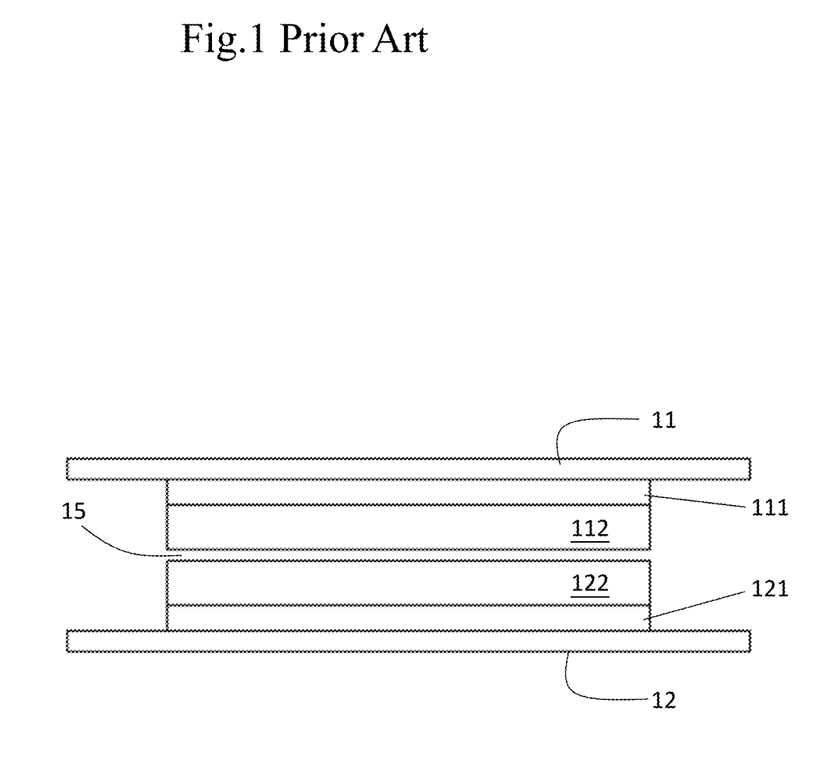
FIG. 1 shows a prior art.

FIG. 1 shows a prior art.

FIG. 1 shows a force sensor which has a top substrate 11 configured on a top side for a user to press. A top electrode 111 is configured on a bottom side of the top substrate 11; a top force sensitive layer 112 is configured on a bottom side of the top electrode 111; a gap 15 is configured on a bottom side of the top piezo material 112; a bottom force sensitive layer 122 is configured on a bottom side of the gap 15; a bottom electrode 121 is configured on a bottom side of the bottom force sensitive layer 122; and a bottom substrate 12 is configured on a bottom side of a bottom electrode 121.

The top force sensitive layer 112 and the bottom force sensitive layer 122 contact with each other when the force sensor is pressed. An electrical path is created among the top electrode 111, the top force sensitive layer 112, the bottom force sensitive layer 122, and the bottom electrode 121 and a corresponding force signal is generated for a control system (not shown) to process.

Figure 2:
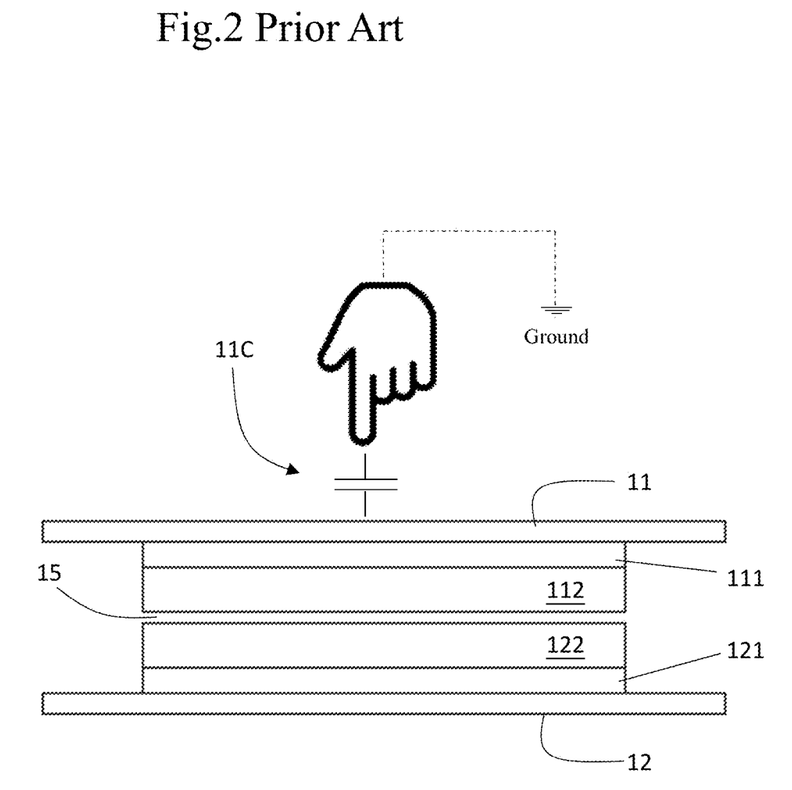
FIG. 2 shows an operation with the prior art.

FIG. 2 shows an operation with the prior art.

FIG. 2 shows an induced capacitance 11C is created when a user's finger touches the force sensor. Noise signals caused by the induced capacitance 11C are generated. The noise signals are annoying especially where a higher precision detection is required. In order to screen noise signals, a relative higher threshold voltage needs to be set. However, the higher the threshold voltage it is, the less the precision is obtained.

Figure 3:
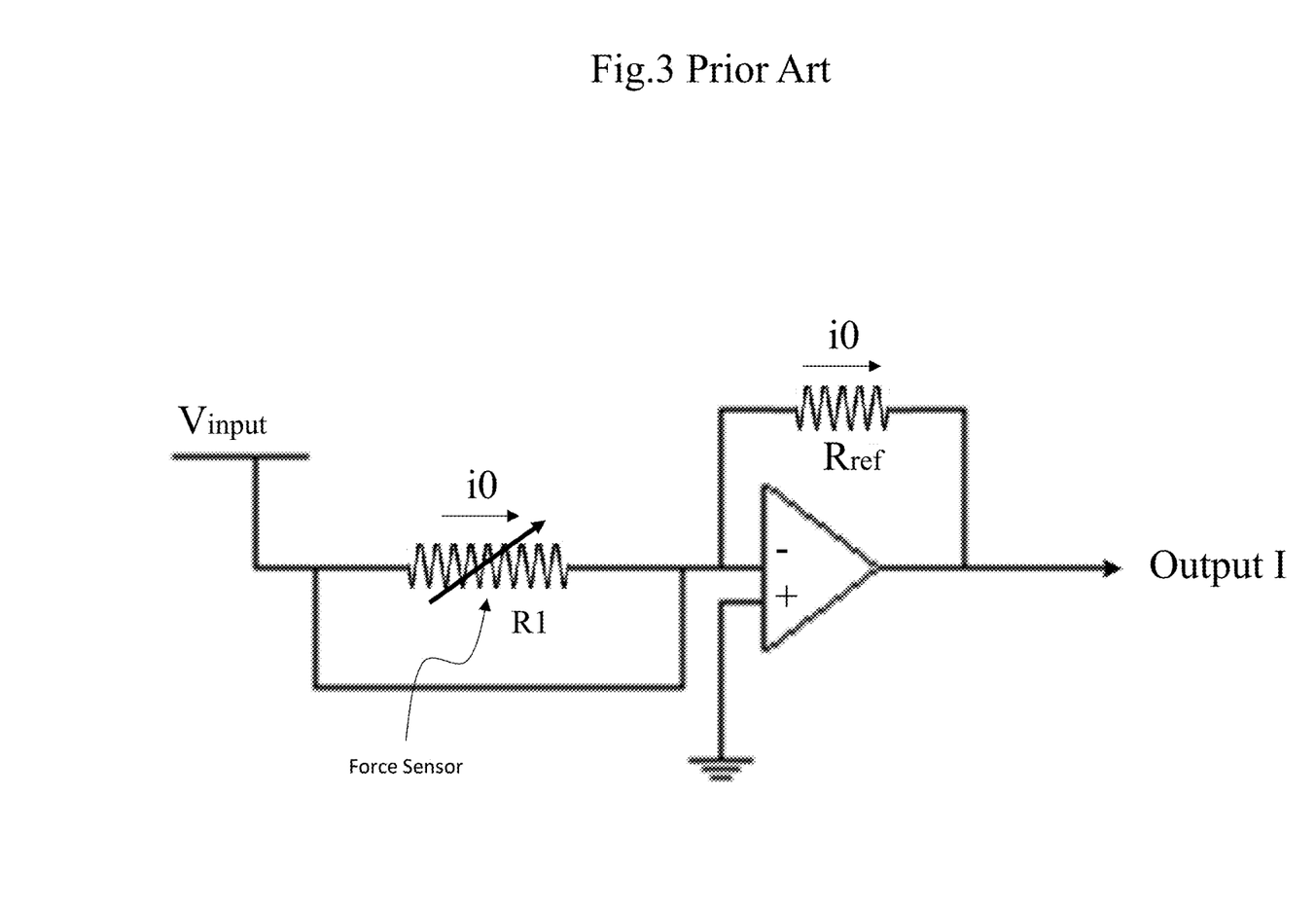
FIG. 3 shows an equivalent circuit for the prior art.

FIG. 3 shows an equivalent circuit for the prior art.

FIG. 3 shows an ideal equivalent circuit for the prior art of FIG. 1. Where the force sensor equivalents to a variable resistor R1. For example, current i0 flows when a force presses the force sensor. Also, a same current i0 passes through the reference resistor Rref., and an output I is obtained. However, it is not an ideal case for an actual operation. Please referring to FIG. 4 for an actual situation, FIG. 4 shows an equivalent circuit when pressed for a prior art force sensor.

Figure 4:
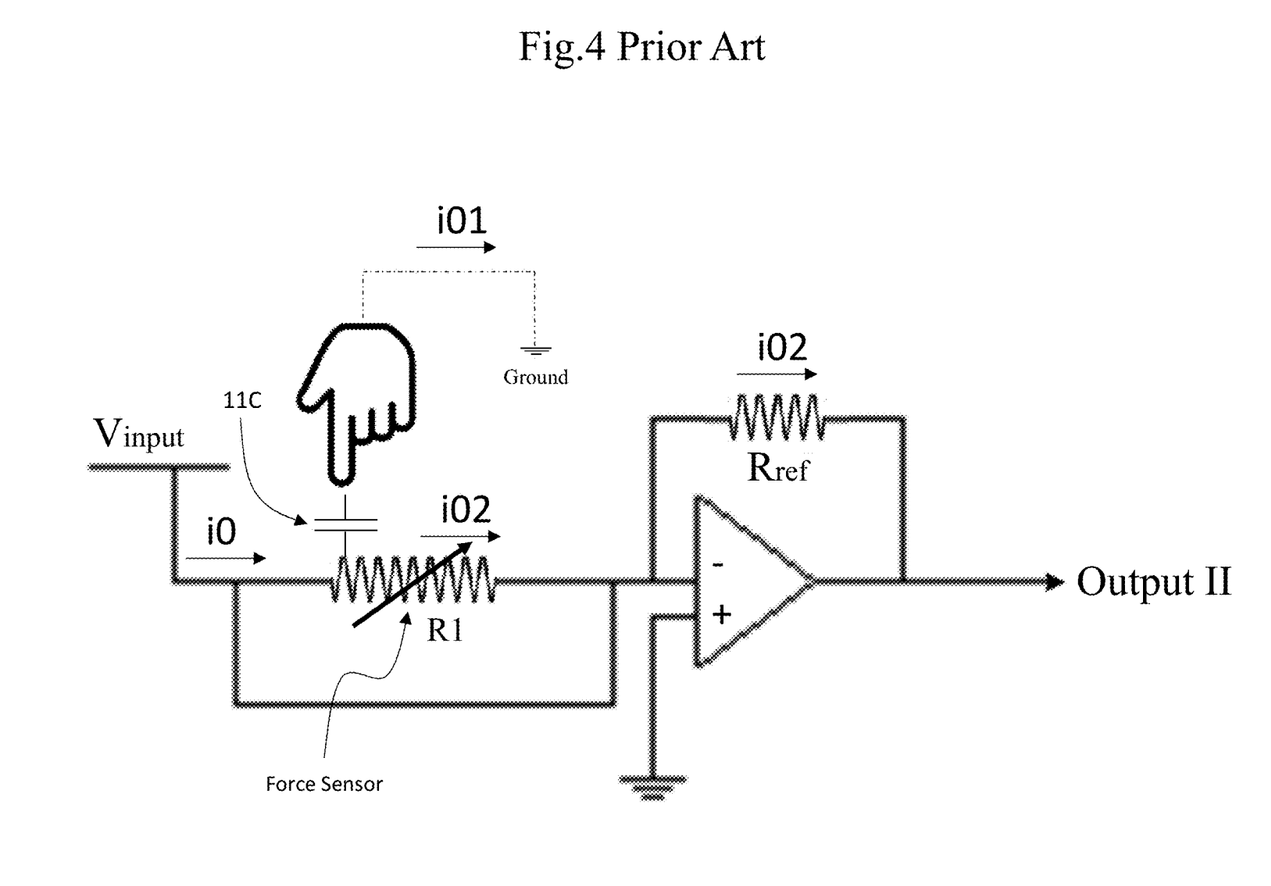
FIG. 4 shows an equivalent circuit when pressed for a prior art force sensor.

FIG. 4 shows an actual situation when a user's finger presses the force sensor. Noise signals (FIG. 5A) are created by an induced capacitance 11C when a user's finger touches the force sensor. The action of user's press equivalents to a resistor parallel connected to the force sensor. A fraction of current flows through the user's finger to ground. FIG. 4 shows as an example when an input current i0 is provided to the force sensor when the force sensor is pressed. A fraction of current i01 flows through the finger to ground, and a fraction of current i02 flows through the force sensor R1 as well as the reference resistor Rref., an output I1 is obtained. However, the output I1 of FIG. 4 shall be smaller than the ideal output I of FIG. 3. It means S/N ratio is relative lower for the prior art.

The disadvantage for the prior art is that a relative lower "signal-to-noise ratio" (S/N ratio) causes noise signals for an electronic system. A relative higher S/N ratio is preferred which eliminate noise signals a lot for an electronic system.

DETAILED DESCRIPTION OF THE INVENTION

Figure 5A:
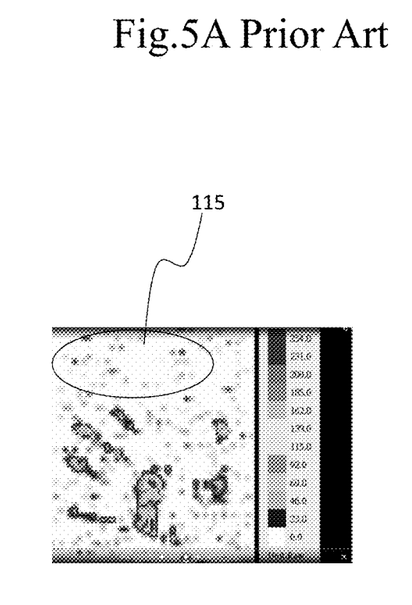
FIG. 5A shows an actual test picture for the prior art.

FIG. 5A shows an actual test picture for the prior art.

FIG. 5A shows a test picture for a multi-touch force sensor according to the prior art which does not have any shielding layer. FIG. 5A shows a plurality of noise signals generated in an area 115 besides normal signals for the palm when a user's palm touches the multi-touch force sensor.

A material for the shielding layer is an electrical conductive material such as metal, conductive polymer, or ito (Indium Tin Oxide). The shielding layer can be formed with network or grid to save the conductive material.

Figure 5B:
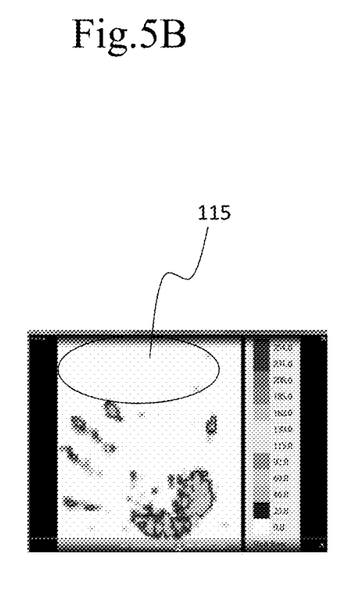
FIG. 5B shows an actual test picture for the present invention.

FIG. 5B shows an actual test picture for the present invention.

FIG. 5B shows a test picture for a multi-touch force sensor according to the present invention which has a noise shielding layer 21 (FIG. 6) configured on top. FIG. 5B shows no significant noise signals generated in an area 115 besides normal signals for the palm when the user's palm touches the force sensor.

Figure 6:
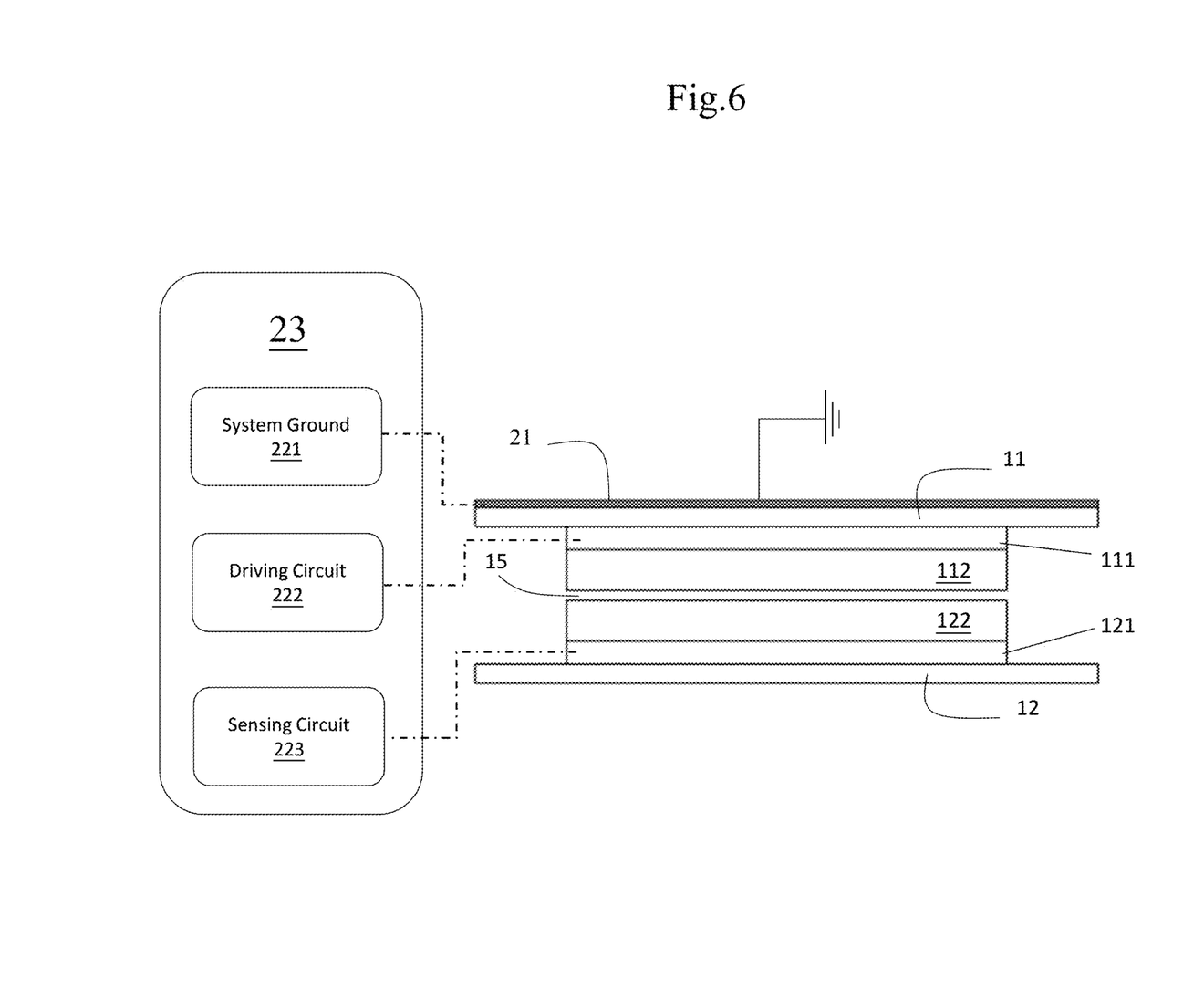
FIG. 6 shows a first embodiment according to the present invention.

FIG. 6 shows a first embodiment according to the present invention.

FIG. 6 shows a force sensor according to the present invention which has a noise shielding layer 21 configured on a top side of a force sensor. FIG. 6 shows a force sensor has a noise shielding layer 21. A top substrate 11 is configured on a bottom side of the top noise shielding layer 21; a top electrode 111 is configured on a bottom side of the top substrate 11; a bottom substrate 12 is configured on a bottom side of a bottom electrode 121; and a pair of force sensitive layers 112, 122 are configured between the top electrode 111 and the bottom electrode 121.

For a modified force sensor (not shown), single layer of force sensitive layer can be adopted and configured between the top electrode 111 and the bottom electrode 121.

The force sensitive layer can be used for the present invention is made of a material selected from a group consisting of piezo-electric material, dielectric material, semi-conductive material, piezo-resistive material and piezo-capacitive material.

Figure 7:
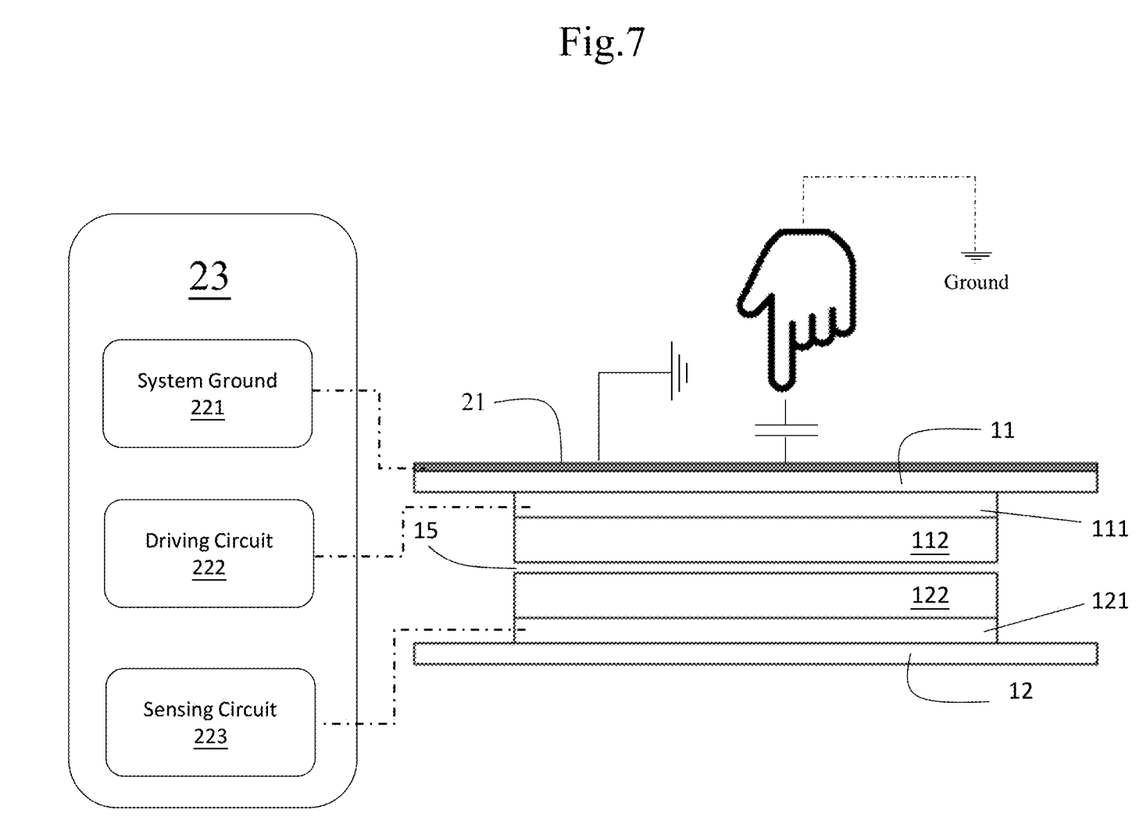
FIG. 7 shows an operation with the first embodiment according to the present invention.

FIG. 7 shows an operation with the first embodiment according to the present invention.

FIG. 7 shows an operation for the first embodiment of FIG. 6. Referring to FIG. 7, an induced capacitor 11C is created when a finger of a user touches the force sensor. Since the noise shielding layer 21 is electrically coupled to system ground, therefore the induced capacitance 11C gives no significant influence to the force sensor. No noise signals shall be generated when the user's finger touches the force sensor.

Figure 8:
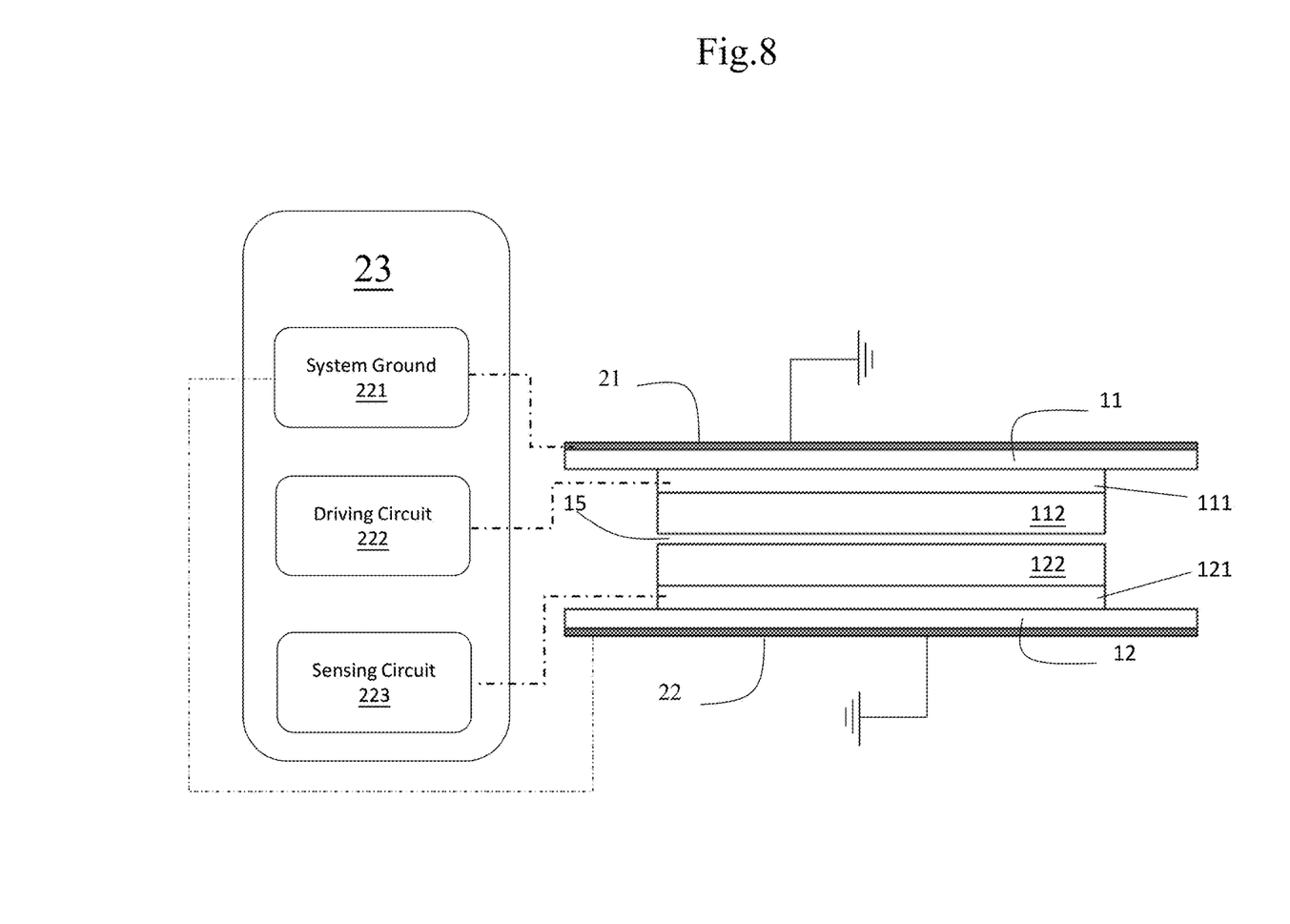
FIG. 8 shows a second embodiment according to the present invention.

FIG. 8 shows a second embodiment according to the present invention.

FIG. 8 shows a second embodiment according to the present invention. In addition to the top noise shielding layer 21 configured on top, a bottom noise shielding layer 22 is configured on a bottom side of the bottom substrate 12. Both the top noise shielding layer 21 and the bottom noise shielding layer 22 are electrically coupled to ground. For the bottom of the force sensor, noise signals can be eliminated under conditions where electrical conductive material may be configured on a bottom side of the force sensor.

Figure 9:
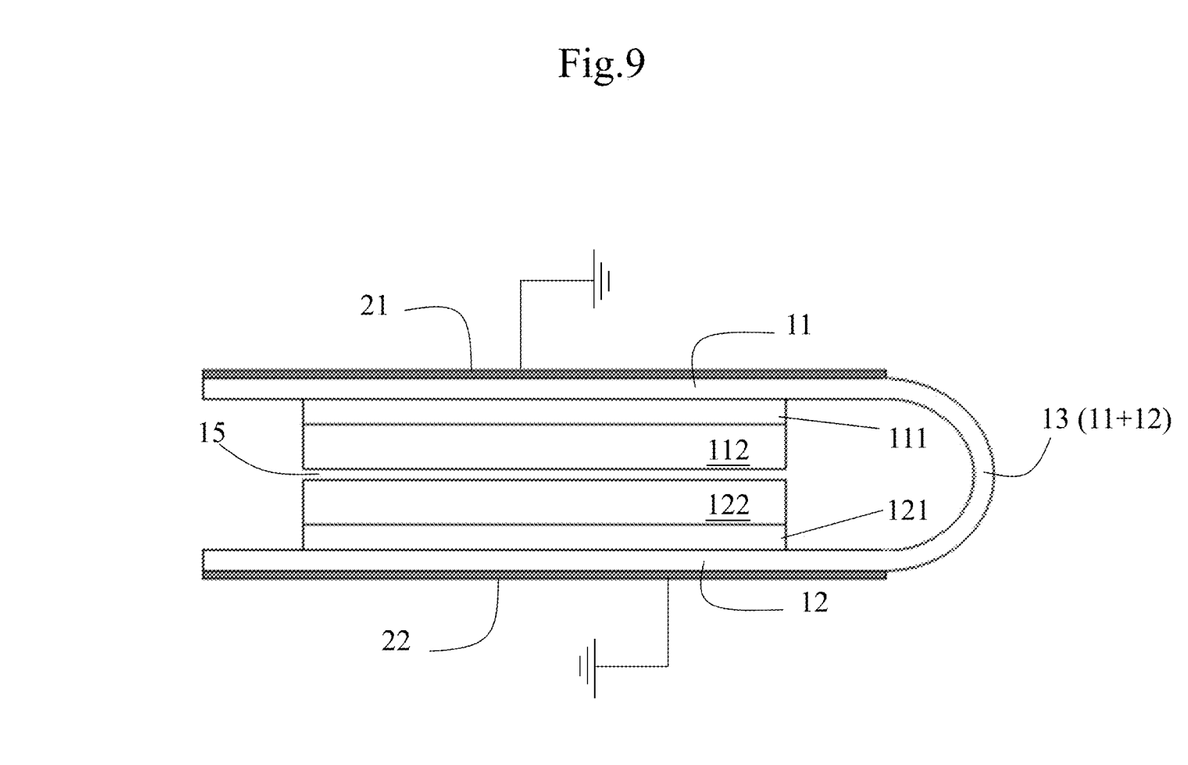
FIG. 9 shows a third embodiment according to the present invention.

FIG. 9 shows a third embodiment according to the present invention.

FIG. 9 shows a modification version from the second embodiment according to the present invention. Where the top substrate 11 and the bottom substrate 12 are integrated into a single substrate 13 (11+12). In other words, the top substrate 11 and the bottom substrate 12 are made as partial elements of a single flexible circuit substrate 13.

Figure 10:
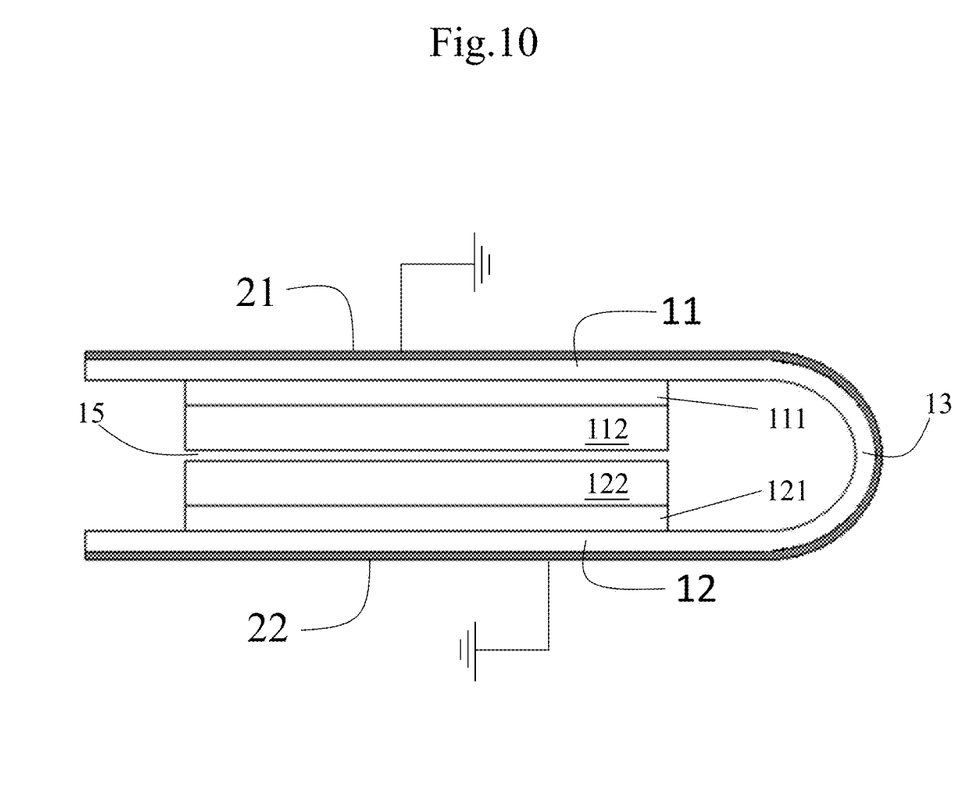
FIG. 10 shows a fourth embodiment according to the present invention.

FIG. 10 shows a fourth embodiment according to the present invention.

FIG. 10 shows a modification version from the third embodiment according to present invention. Where the bottom noise shielding layer 22 and the top noise shielding layer 21 are integrated into a single shielding layer. In other words, the bottom noise shielding layer 22 and the top noise shielding layer 21 are made as partial elements of a single flexible circuit substrate 13. After assembly, the integrated bottom noise shielding layer 22 and the top noise shielding layer 21 is electrically coupled to system ground.

Figure 11A:
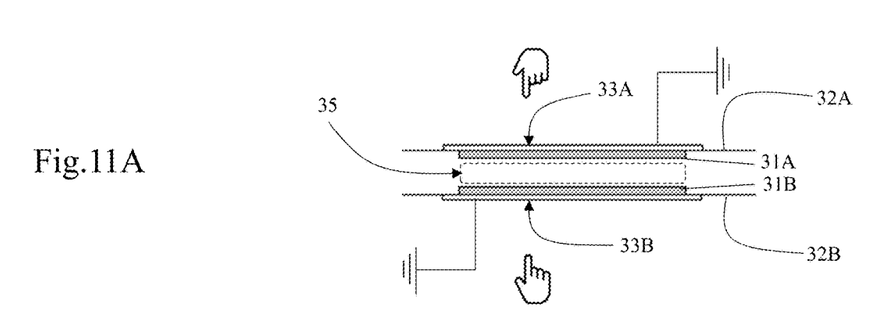
FIGS. 11A~11C show force sensors categorized by electrodes configuration applied with noise shielding layer according to the present invention.
Figure 11B:
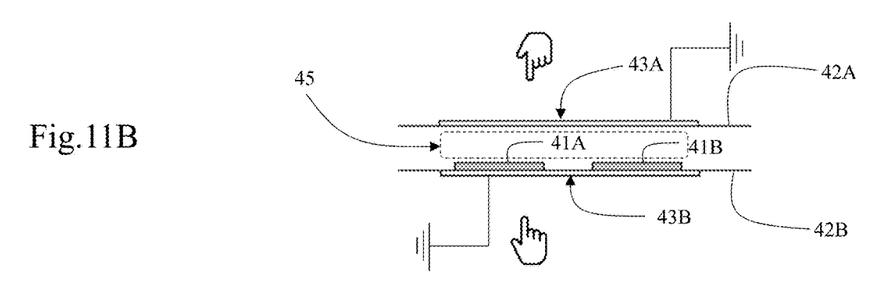
Figure 11C:
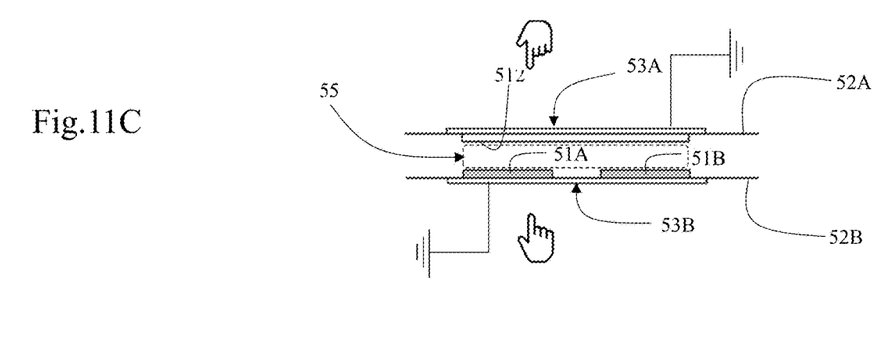

FIGS. 11A~11C show force sensors categorized by electrodes configuration applied with noise shielding layer according to the present invention.

FIG. 11A shows a force sensor has a top electrode 31A and a bottom electrode 31B. The top electrode 31A is configured on a bottom surface of a top substrate 32A. The bottom electrode 31B is configured on a top surface of a bottom substrate 32B. A top noise shielding layer 33A is configured on a top surface of the top substrate 32A. A bottom noise shielding layer 33B is optionally configured on a bottom surface of the bottom substrate 32B. An intermediate layer 35 can be inserted between the top electrode 31A and the bottom electrode 31B.

A material for the intermediate layer 35 is selected from a group consisting of an air space, piezo-capacitive material, and compressive-restorable dielectric material, so that the force sensor functions as a variable capacitor with AC power. Alternatively, a material for the intermediate layer 35 is selected from a group consisting of piezo-electric material, piezo-resistive material, compressible-restorable semiconductor polymer, so that the force sensor functions as a variable resistor with DC power.

FIG. 11B shows a force sensor has a coplanar electrodes 41A, 41B. The coplanar electrodes 41A, 41B are configured on a top surface of a bottom substrate 42B. A top noise shielding layer 43A is configured on a top surface of a top substrate 42A. A bottom noise shielding layer 43B is optionally configured on a bottom surface of the bottom substrate 42B. An intermedia layer 45 is inserted between the top substrate 42A and the bottom substrate 42B.

A material for the intermedia layer 45 is selected from a group consisting of piezo-capacitive material, and compressive-restorable dielectric material, so that the force sensor functions as a variable capacitor with AC power.

Alternatively, a material for the intermedia layer 45 is selected from a group consisting of piezo-electric material, piezo-resistive material, compressible-restorable semiconductor polymer, so that the force sensor functions as a variable resistor with DC power.

FIG. 11C shows a force sensor has a coplanar electrodes 51A, 51B, and an auxiliary metal 512. The coplanar electrodes 51A, 51B are configured on a top surface of a bottom substrate 52B. The auxiliary metal 512 is configured on a bottom surface of the top substrate 52A. A top noise shielding layer 53A is configured on a top surface of a top substrate 52A. A bottom noise shielding layer 53B is optionally configured on a bottom surface of the bottom substrate 52B. An intermediate layer 55 can be inserted between the auxiliary metal 512 and the bottom substrate 42B.

The auxiliary metal 512 is an independent metal layer to enhance an even distribution for electric field, and without connecting to any electrode.

A material for the intermediate layer 55 is selected from a group consisting of an air space, piezo-capacitive material, and compressive-restorable dielectric material. So that the force sensor functions as a variable capacitor with AC power.

Alternatively, a material for the intermediate layer 55 is selected from a group consisting of piezo-electric material, piezo-resistive material, compressible-restorable semiconductor polymer. So that the force sensor functions as a variable resistor with DC power.

Table 1 shows Electrode Configuration v Intermediate Layer choices for the force sensor of FIGS. 11A~11C.

TABLE 1

Electrode configuration v Intermediate layer choices.

| Electrode Configuration | Intermediate Layer Choices | Force sensor equivalent to | Power |
|---|---|---|---|
| Top, bottom electrodes (FIG. 11A) | Air space; piezo-capacitive material; dielectric material; | variable capacitor | AC |
| | Piezo-electric material; Piezo-resistive material; Semiconductor polymer; | variable resistor | DC |
| Coplanar electrodes (FIG. 11B) | piezo-capacitive material; dielectric material; | variable capacitor | AC |
| | Piezo-electric material; Piezo-resistive material; Semiconductor polymer; | variable resistor | DC |
| Coplanar electrodes plus Enhancing metal layer (FIG. 11C) | Air space; piezo-capacitive material; dielectric material; | variable capacitor | AC |
| | Piezo-electric material; Piezo-resistive material; Semiconductor polymer; | variable resistor | DC |

Figure 12A:
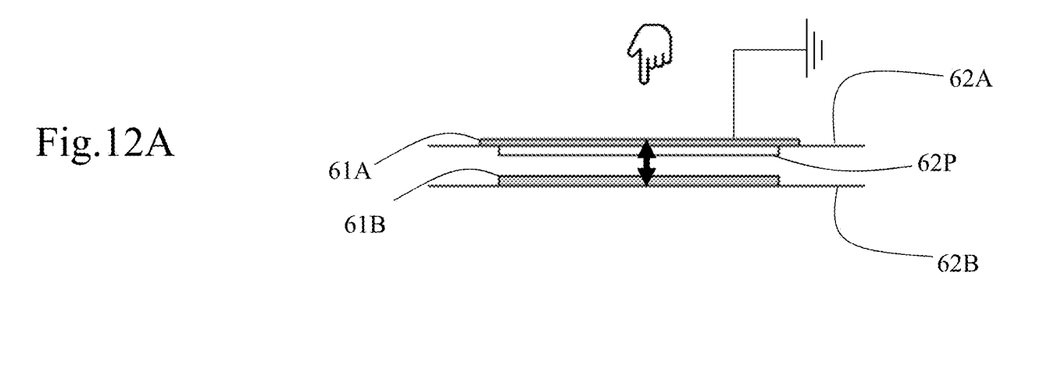
FIG. 12A shows a fifth embodiment according to the present invention.

FIG. 12A shows a fifth embodiment according to the present invention.

FIG. 12A shows that a variable capacitor force sensor is formed by a configuration where a top electrode 61 is prepared. A top substrate 62A is configured on a bottom surface of the top electrode 61A. A piezo capacitive material 62P is configured on a bottom of the top substrate 62A. A bottom electrode 61B is configured on a bottom of the piezo capacitive material 62P. A bottom substrate 62B is configured on a bottom surface of the bottom electrode 61B.

The top electrode 61A is electrically coupled to ground, so that the top electrode 61A functions as a shielding layer and, in the meanwhile, functions as a counter electrode with respect to the bottom electrode 61B. i.e. the top electrode 61A and the bottom electrode 61B forms a variable capacitor force sensor. Capacitance exists between the top electrode 61A and the bottom electrode 61B as shown in heavy arrow in the FIGS. 12A-12B.

The variable resistor force sensor of FIG. 13A can be pressed from top side, as shown by the finger on top, with noise shielding protection.

An air space or a compressible-restorable material can be used to replace the piezo capacitive material 62P.

Figure 12B:
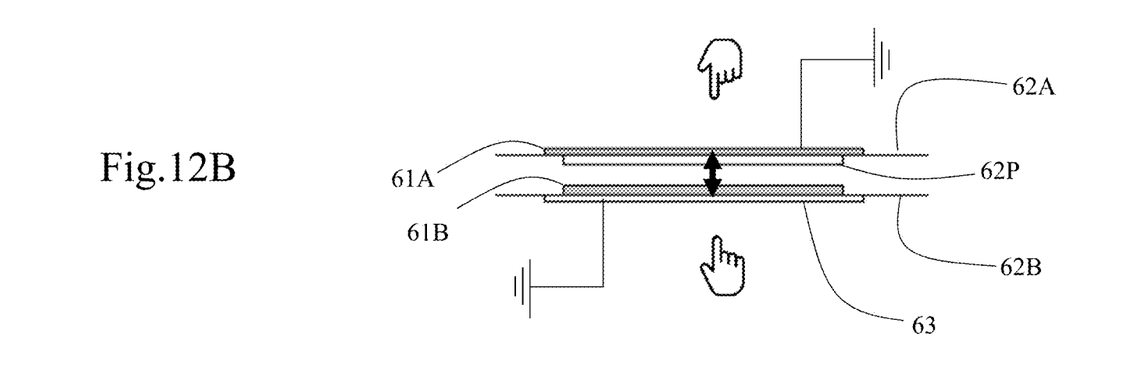
FIG. 12B shows a modified embodiment to FIG. 12A according to the present invention.

FIG. 12B shows a modified embodiment to FIG. 12A according to the present invention.

FIG. 13B shows a bottom shielding layer 63, electrically coupled to ground, is optionally configured on a bottom surface of the bottom substrate 62B so that the variable resistor force sensor of FIG. 13B can be pressed from either top side or bottom side, as shown by the fingers on top and bottom, with noise shielding protection.

While several embodiments have been described by way of examples, it will be apparent to those skilled in the art that various modifications may be configured without departs from the spirit of the present invention. Such modifications are all within the scope of the present invention, as defined by the appended claims.

| Numerical system |
|---|
| top substrate 11 |
| top electrode 111 |
| force sensitive layers 112, 122 |
| Area 115 |
| induced capacitor 11C |
| bottom substrate 12 |
| substrate 13 (11 + 12) |
| noise shielding layer 21 |
| noise shielding layer 22 |
| electrode 31A, 31B |
| substrate 32A, 32B |
| noise shielding layer 33A, 33B |
| intermediate layer 35, 45, 55 |
| electrode 41A, 41B |
| substrate 42A, 42B |
| noise shielding layer 43A, 43B |
| electrode 51A, 51B |
| substrate 52A, 52B |
| noise shielding layer 53A, 53B |
| top electrode 61A (top shielding layer 61A) |
| bottom electrode 61B |
| top substrate 62A |
| bottom substrate 62B |
| piezo capacitive material 62P |
| bottom shielding layer 63 |

What is claimed is:

1. A force sensor, comprising:
a top substrate and a bottom substrate;
a pair of electrodes configured on at least one of the top substrate and the bottom substrate;
a first noise shielding layer electrically coupled to ground, defining a first area for a user's press, and configured on one of a top surface of the top substrate and a bottom surface of the bottom substrate.

2. A force sensor as claimed in claim 1, further comprising:
a second noise shielding layer electrically coupled to ground, defining a second area for a user's press, and configured on the other one of the top surface of the top substrate and the bottom surface of the bottom substrate.

3. A force sensor as claimed in claim 2, wherein
the second noise shielding layer and the first noise shielding layer are formed from a single shielding layer.

4. A force sensor as claimed in claim 1, further comprising:
an intermediate layer configured between the top substrate and the bottom substrate, wherein
the intermediate layer is selected from the group consisting of piezo-capacitive material, compressive-restorable dielectric material, piezo-electric material, piezo-resistive material, and compressible-restorable semiconductor polymer.

5. A force sensor as claimed in claim 1, wherein
the top substrate and the bottom substrate are formed from a single substrate.

6. A force sensor as claimed in claim 1, wherein the pair of electrodes includes:
a top electrode configured on a bottom surface of the top substrate, and
a bottom electrode configured on a top surface of the bottom substrate.

7. A force sensor as claimed in claim 1, wherein
the pair of electrodes includes coplanar first and second electrodes configured on a top surface of the bottom substrate.

8. A force sensor, comprising:
a top substrate and a bottom substrate;
a pair of electrodes configured on at least one of the top substrate and the bottom substrate; and
a first noise shielding layer electrically coupled to ground, defining a first area for a user's press, and configured on one of a top surface of the top substrate and a bottom surface of the bottom substrate, wherein
the top substrate and the bottom substrate are formed from a single substrate.

9. A force sensor as claimed in claim 8, further comprising:
a second noise shielding layer electrically coupled to ground, defining a second area for a user's press, and configured on the other one of the top surface of the top substrate and the bottom surface of the bottom substrate.

10. A force sensor as claimed in claim 9, wherein
the second noise shielding layer and the first noise shielding layer are formed from a single shielding layer.

11. A force sensor as claimed in claim 8, further comprising:
an auxiliary metal configured on a bottom surface of the top substrate.

12. A force sensor as claimed in claim 11, further comprising:
an intermediate layer configured between the auxiliary metal and the pair of coplanar electrodes, wherein
the pair of electrodes includes coplanar first and second electrodes configured on a top surface of the bottom substrate, and
the intermediate layer is selected from a group consisting of piezo-capacitive material, compressive-restorable dielectric material, piezo-electric material, piezo-resistive material, and compressible-restorable semiconductor polymer.

13. A force sensor as claimed in claim 8, wherein the pair of electrodes includes:
    a top electrode configured on a bottom surface of the top substrate, and
    a bottom electrode configured on a top surface of the bottom substrate.

14. A force sensor as claimed in claim 8, wherein
the pair of electrodes includes coplanar first and second electrodes configured on a top surface of the bottom substrate.

15. A force sensor, comprising:
    a top substrate and a bottom substrate;
    a top electrode configured on a top surface of the top substrate, defining a first area for a user's press, and electrically coupled to ground;
    a bottom electrode configured on a top surface of the bottom substrate; and
    an intermediate layer configured between the top substrate and the bottom electrode, wherein
    the top electrode is configured as a first shielding layer and also as a counter electrode with respect to the bottom electrode, and
    the intermediate layer is selected from the group consisting of piezo-capacitive material, compressive-restorable dielectric material, piezo-electric material, piezo-resistive material, and compressible-restorable semiconductor polymer.

16. A force sensor as claimed in claim 15, further comprising:
    an air space between the intermediate layer and the bottom electrode.

17. A force sensor as claimed in claim 15, further comprising:
    a second noise shielding layer electrically coupled to ground, defining a second area for a user's press, and configured on a bottom surface of the bottom substrate.

18. A force sensor as claimed in claim 15, wherein
the top substrate and the bottom substrate are formed from a single substrate.

19. A force sensor as claimed in claim 18, further comprising:
    a second noise shielding layer electrically coupled to ground, defining a second area for a user's press, and configured on a bottom surface of the bottom substrate, wherein
    the second noise shielding layer and the first noise shielding layer are formed from a single shielding layer.

* * * * *